United States Patent [19]

Randall

[11] Patent Number: 4,873,704

[45] Date of Patent: Oct. 10, 1989

[54] METHOD AND APPARATUS FOR EFFECTIVELY DOUBLING THE OPERATIONAL SPEED OF SELECTED DIGITAL CIRCUITS

[75] Inventor: Jack E. Randall, Savage, Minn.

[73] Assignee: CPT Corporation, Minneapolis, Minn.

[21] Appl. No.: 191,707

[22] Filed: May 9, 1988

[51] Int. Cl.$^4$ .............................................. H03K 3/02
[52] U.S. Cl. ........................................ 377/47; 328/20; 307/303
[58] Field of Search ............................. 377/47; 328/20; 307/303

[56] References Cited

U.S. PATENT DOCUMENTS

| | | | |
|---|---|---|---|
| 3,714,470 | 1/1973 | Goldberg | 307/494 |
| 4,077,010 | 2/1978 | Ryon | 377/47 |
| 4,669,099 | 5/1987 | Zinn | 328/20 |
| 4,691,170 | 9/1987 | Riley | 377/47 |
| 4,777,448 | 10/1988 | Satoh | 377/47 |

OTHER PUBLICATIONS

"A Simple Digital 2" Frequency Multiplier" by Kumar et al., Electronics, vol. 48, No. 1, pp. 43–45, 1/1980.

*Primary Examiner*—John S. Heyman
*Attorney, Agent, or Firm*—Lieberman, Rudolph & Nowak

[57] ABSTRACT

A method and apparatus for effectively doubling the operational speed of certain digital circuit designs. In particular, a digital clock operating at a first frequency is utilized to effectively drive TTL shift registers at twice the frequency of the digital clock. This effective doubling of the clock speed is achieved without the necessity of resorting to expensive and high power consumption circuit designs.

14 Claims, 3 Drawing Sheets

METHOD AND APPARATUS FOR EFFECTIVELY DOUBLING THE OPERATIONAL SPEED OF SELECTED DIGITAL CIRCUITS

FIELD OF THE INVENTION

This invention relates generally to method and apparatus for effectively increasing the operational speed of certain digital circuit designs, and more particularly to a unique circuit arrangement capable of effectively doubling clock speed and the rate of parallel to serial conversion while using TTL type circuit elements.

BACKGROUND OF THE INVENTION

Transistor-transistor logic (TTL) is a logic circuit family currently in widespread use, is relatively inexpensive, and TTL is also the fastest logic family which operates the individual transistor elements in the saturation region. State-of-the-art integrated circuit design makes wide use of the TTL family due to its many advantages and operational capabilities.

One current disadvantage in using the TTL family, however, is its inability to operate at very high speeds, that is TTL circuits are generally unsable to operate at clock rates of over 100 MHZ. There are, however, many circuit applications where an operational rate greatly exceeding 100 MHZ is necessary, which circuit applications would preferably be designed with TTL circuits, due to its relatively low cost and wide availability. Because operational speeds in excess of 100 MHZ, are not possible with TTL circuits, other alternatives to attain high speed operations have been considered.

One common alternative to the use of TTL circuits in high speed applications is the use of Emitter-Coupled Logic (ECL). The ECL family is the fastest form of integrated circuit logic currently availale, and is sometimes referred to as current-mode logic, current-steering logic, or non-saturating logic. High speed operation of ECL circuits is possible because transistor saturation is prevented by the basic circuit design, and the fact that the transistors are not in saturation permits faster switching operations. Many high speed applications make use of ECL circuitry, one of which is described in U.S. Pat. No. 4,238,774 by Frederich D. Lehman, and assigned to the same assignee CPT Corporation, as is the instant application. In U.S. Pat. No. 4,238,774, there is described a drive circuit for a high resolution cathode ray tube display. The improved drive circuit described in this patent permits the operating frequency of the horizontal drive for the CRT to be increased by a factor of four, and the operating frequency of the video drive for the CRT to be increased by a factor of ten. Through use of the ECL circuit design, the drive circuit described in the '774 patent is able to achieve horizontal operational frequencies of approximately 50 KHZ and video drive operational frequencies of approximately 200 MHZ.

Although use of ECL, as described in U.S. Pat. No. 4,238,774 permits extremely high speed operation to be achieved, several problems arise when using ECL circuit designs. First, ECL is substantially more expensive than comparable TTL circuits. For example, a high speed clock designed using ECL can be three-five times more expensive than a comparable design in TTL. Second, certain circuit designs which are generally an "off-the-shelf" purchase in TTL are often a custom order in ECL due to the somewhat lesser availability of standard ECL designs, as opposed to the widespread availability of TTL designs. As is well known in the electronics industry, the necessity to "custom order" any device often results in substantial delay, as well as the attendant increased cost. The third disadvantage, and perhaps the most important, is the fact that ECL circuit designs generally consume substantially more power than do comparable TTL designs, which power consumption is completely unsuitable for certain applications.

It is, therefore, a general object of the instant invention to provide method and apparatus for effectively increasing the operational speed of digital circuitry, while maintaining, to the extent possible, the use of TTL devices.

It is another object of the instant invention to achieve high speed operation of digital circuitry, while avoiding, to the extent possible, use of ECL circuit elements.

It is a further object of the instant invention to provide a high speed digital circuit design, which is low in cost, low in power consumption, but capable of attaining very high operating frequencies.

SUMMARY OF THE INVENTION

The instant invention provides method and apparatus for achieving very high operating frequencies of certain digital circuits, while making use, to the greatest extent possible, of TTL type circuit elements to achieve low cost and reduced power consumption.

In accordance with a first aspect of the instant invention, a novel clock circuit is provided in which the operating frequency of a TTL type digital clock is effectively doubled by applying the output of the digital clock to circuitry which generates both a positive going clock signal and a negative going clock signal, each signal being equal in frequency to the frequency of the digital clock. The positive going signal is applied to a first differential amplifier and the negative going signal is applied to a second differential amplifier, with both the first and second differential amplifiers residing on the same silicon substrate. The resultant outputs from the two differential amplifiers are two clock signals, each of which is equal in frequency to the frequency of the digital clock, but which signals are precisely 180° out of phase. Through utilization of the leading edge of each of the two waveforms, an effective doubling of the clock frequency is obtained.

In accordance with a further aspect of the invention, the effective doubling of the digital clock rate is utilized in conjunction with a high speed parallel-to-serial converter for converting parallel digital words into a plurality of serial data streams comprising:

a plurality of shift registers, each shift register having applied thereto in parallel, selected, parallel bits of said multibit digital words;

a digital clock operating at a first frequency, means for effectively doubling the first frequency of said digital clock by producing a plurality of digital waveforms, each waveform having a frequency equal to said first frequency and each waveform being the inverse of the other waveform, with a predetermined phase relationship between said waveforms; and means for selectively applying each of said waveforms to selected ones of said shift registers to alternately operate said shift registers, whereby said parallel multibit digital words are converted into a plurality of serial data streams at a data rate effectively equal to twice said first frequency.

In accordance with a still further aspect of the invention, said positive going waveform applied to said first differential amplifier, generates a phase "A" clock signal, while said negative going waveform applied to said second differential amplifier generates a phase "B" clock signal, said phase "A" clock signal being applied to a first flip-flop to generate a load "A" clock signal, and said phase "B" clock signal being applied to a second flip-flop to generate a load "B" clock signal.

In accordance with another aspect of the instant invention, high speed parallel to serial conversion is accomplished by selectively applying said phase "A" clock signal, said phase "B" clock signal, said load "A" clock signal and said load "B" clock signal, to said shift registers wherein said phase "A" clock signal is 180° out of phase with said phase "B" clock signal, and said load "A" clock signal is 90° out of phase with said load "B" clock signal.

While the invention will be described with respect to certain preferred embodiment circuit configurations, and with respect to particular types of circuit compositions, it will be understood that the invention is not limited in any manner by such circuit configurations or compositions.

In particular, although certain circuit compositions are described herein as being of the TTL or ECL type circuit designs, it is understood that such particular circuit types are not necessarily to be construed in a limiting manner.

The principals of the instant invention apply generally to method and apparatus for effectively increasing the operational speed of certain digital circuit designs, without the necessity to resort to high cost, high power consumption ECL type circuitry. However, other variations of the invention will become apparent to one skilled in the art upon review of the following detailed description of the invention.

These and other objects and features of the invention will be more fully appreciated from the following detailed description when taken in conjunction with the accompanying drawings, in which:

DETAILED DESCRIPTION OF THE DRAWINGS

DETAILED DESCRIPTION OF THE INVENTION

In particular applications, such as in the design of high speed resolution CRT displays, it is important to achieve very high operating frequencies for the logic circuits. This is necessary because there is a direct correlation between high frequency operation and the clarity and resolution of the display, thus a high quality, high resolution CRT requires logic circuits, which operate above 100 MHZ. Such operating frequencies are not possible with TTL and, thus, prior high speed designs generally used "high speed" ECL designs. The instant invention, which finds application in a high resolution CRT display, such as the CPT High Resolution Display System, manufactured by CPT Corporation of Minneapolis, Minn., achieves operating frequencies in excess of 100 MHZ, while utilizing primarily a TTL design with very limited use of ECL circuits.

Figure 1:
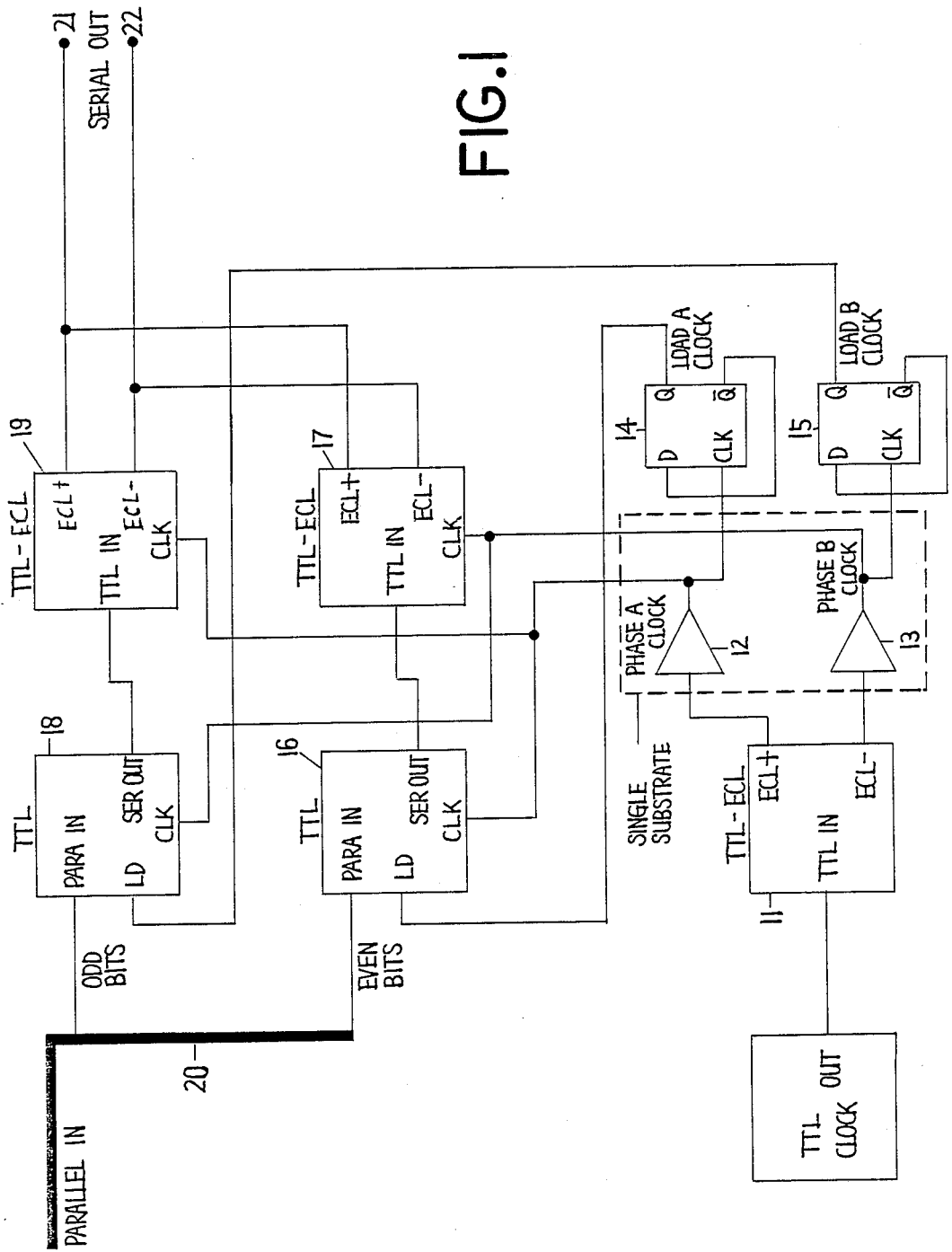
FIG. 1 is a block diagram illustration of the instant invention.

Referring now to FIG. 1, there is shown the circuit of the instant invention in which the clock speed of a 60 MHZ TTL clock is effectively doubled to provide a 120 MHZ clock, and that clock is then used to drive a unique parallel to serial converter which can convert a multibit byte into two serial data streams at an operating frequency of 120 MHZ.

Figure 2:
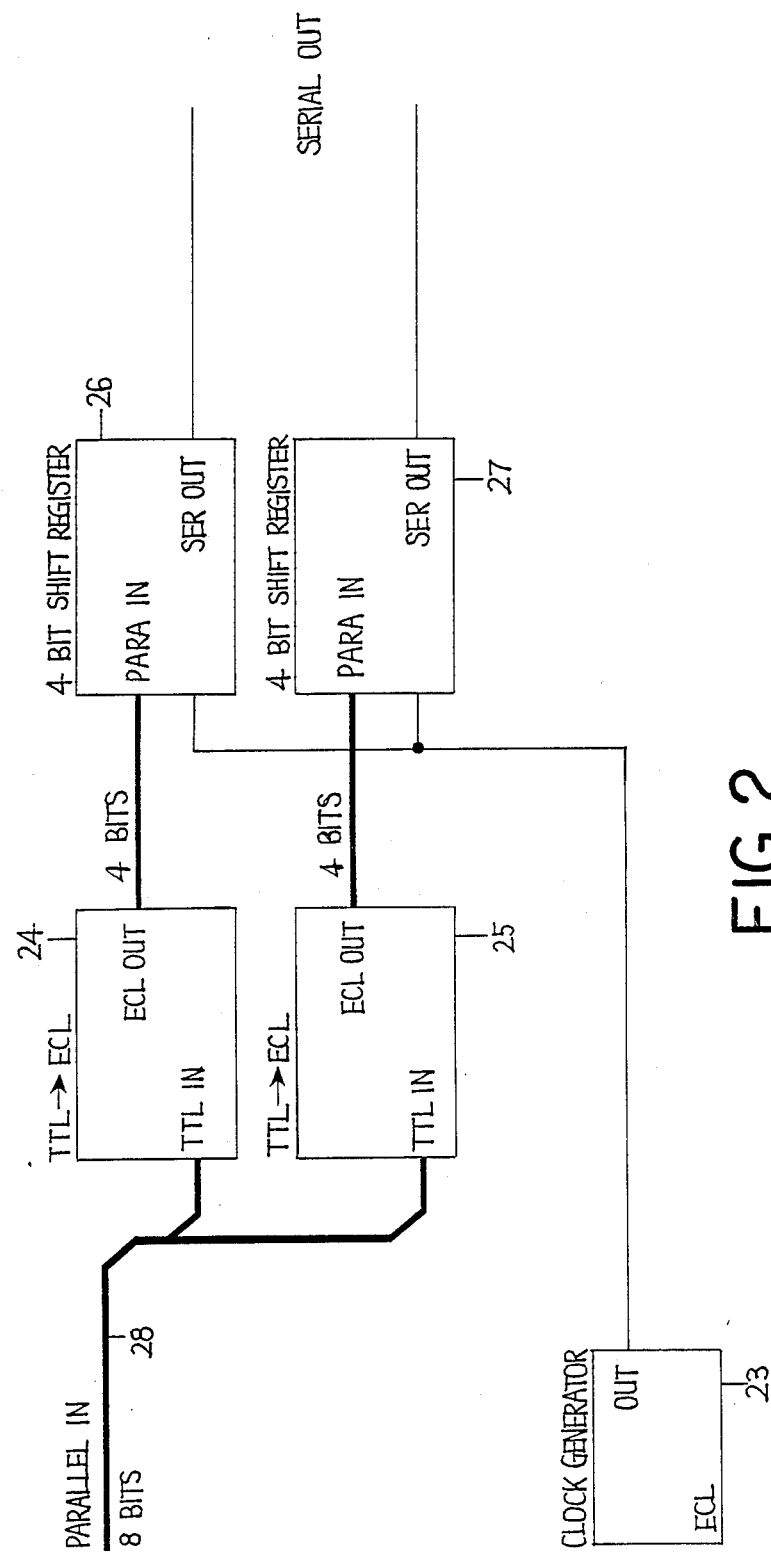
FIG. 2 is an illustration of one prior art method of accomplishing parallel to serial conversion.

FIG. 2 demonstrates how high speed parallel to serial conversion has been done in the prior art. More particularly, in order to achieve, for example, an operating frequency of 120 MHZ, it is necessary to provide 120 MHZ clock 23, which must be an ECL design as it is operating above the highest frequency possible, with TTL design limits. Parallel data in the form of TTL form at 8-bit words are received on bus 28 and applied to TTL to ECL converters 24 and 25. Such converters are well known and commercially available from Motorola Semiconductors Inc. and, thus, no further description will be given of their operation. The 8-bit TTL word is thus converted into two 4-bit ECL words, each 4-bit ECL word being applied to 4-bit shift registers 26 and 27. The 4-bit ECL shift registers are driven at 120 MHZ by ECL clock 23 to convert the incoming parallel data into two serial data streams with a frequency of 120 MHZ. The parallel to serial conversion illustrated in FIG. 2, thus requires at least two TTL to ECL converters, plus two ECL shift registers. The instant invention accomplishes this same task, but uses substantially all TTL logic, which is lower in cost, lower in power consumption and widely available.

Referring again to FIG. 1, the instant invention will be described in conjunction with the timing diagram set forth in FIG. 3. More particularly, clock 10 is a TTL clock operating at 60 MHZ. The output of clock 10 is applied to the input of TTL to ECL converter 11. Converter 11 can be the same type of TTL to ECL converter described as converters 24 and 25 in FIG. 2. The output of converter 11 is an ECL positive waveform and an ECL negative waveform, with the ECL positive waveform being applied to differential amplifier 12, and the ECL negative waveform being applied to differential amplifier 13. The output of amplifiers 12 and 13 are shown as the phase "A" clock and phase "B" clock waveforms in FIG. 3.

Figure 3:
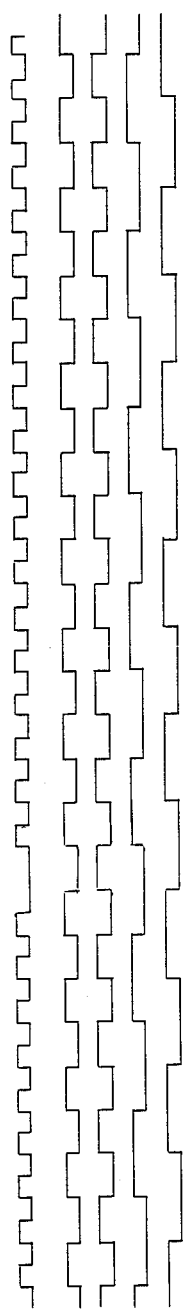
FIG. 3 is a timing diagram demonstrating the operation of the instant invention in accordance with FIG. 1.

As indicated by the phase "A" clock and phase "B" clock waveforms in FIG. 3, what has been produced is two 60 MHZ waveforms which are perfectly phased and inverted. The phase difference between the two waveforms must be exact, as perfect phasing is crucial to achieve an effective doubling of the clock speed from 60 MHZ to 120 MHZ. In order to achieve perfect phasing, differential amplifiers 12 and 13 must reside on the same silicon chip, so that the two ECL signals experience precisely the same amount of delay. If the amount of delay is not exactly the same, the result will be skew in the 120 MHZ clock. It is, of course, understood that by using the leading edges of the two perfectly phased and inverted 60 MHZ clocks, one achieves an effective clock rae of 120 MHZ, which is shown as the "DOT clock" waveform in FIG. 3.

As shown in FIG. 1, the phase "A" clock signal is applied to the clock input port of TTL type shift register 16, as well as applied to the clock input port of TTL to ECL converter 19. Similarly, the phase "B" clock signal is applied to the clock input port of TTL type shift register 18, as well as applied to the clock input port of TTL to ECL converter 17.

The phase "A" and phase "B" clock signals are also applied to flip-flop 14 and 15 respectively, which flip-flops in turn generate a load "A" clock signal and a load "B" clock signal. The load "A" clock signal is applied to the load command port of shift register 16, while the load "B" clock signal is applied to the load common port of shift register 18.

As illustrated in FIG. 3, the phase "A" and phase "B" clock signals are precisely 180° out of phase, while the load "A" and load "B" clock signals are precisely 90° out of phase.

Odd numbered bits of the multibit digital words appearing on bus 20 are applied in parallel to the data input of shift register 18, while even numbered bits are applied to the data input of shift register 16. Due to the precise difference in phase between the phase "A" and phase "B" clock signals, as well as between the load "A" and load "B" clock signals, the TTL shift registers 16 and 18 are effectively operated at twice the operating frequency of clock 10. For example, if clock 10 operates at a frequency of 60 MHZ, the effective operating frequency of registers 16 and 18 is equal to 120 MHZ.

The serial outputs of registers 16 and 18 are applied to TTL to ECL converters 17 and 19 respectively. The outputs of converters 17 and 19 are combined at output leads 21 and 22 to generate two ECL type data streams operating at a frequency which is precisely equal to twice the frequency of clock 10. What has been accomplished, therefore, is to generate the two serial data streams operating at twice the frequency of clock 10. In the example where clock 10 is comprised of TTL type circuitry, the clock cannot be operated at a frequency in excess of 100 MHZ, but can operate effectively at a frequency of sixty MHZ. Through utilization of the circuitry described in FIG. 1, the effective operating frequency of clock 10 is doubled to 120 MHZ and can be used to achieve parallel to serial conversion at that data rate. This is accomplished without the necessity of extensive use of ECL type logic, thus, reducing the cost and power consumption of the circuitry necessary to attain this operating frequency.

While a particular embodiment of the instant invention has been described with respect to increasing the effective operating speed of certain digital circuits, it should be understood by those skilled in the art that the invention is not limited to the specific application and embodiment described herein.

It will be appreciated by those skilled in the art that other circuit configurations that embody the principles of this invention and other applications other than as described herein can be configured within the spirit and scope of this invention.

What is claimed is:

1. A high speed parallel to serial converter for converting parallel multibit digital words into a plurality of serial data streams, comprising;
   a plurality of shift registers, each shift register having applied thereto in parallel, selected parallel bits of said multibit digital words,
   a digital clock operating at a first frequency,
   means for effectively doubling the first frequency of said digital clock by producing a plurality of digital waveforms, each waveform having a frequency equal to said first frequency and each waveform being the inverse of the other waveform with a predetermined phase relationship between said waveforms; and
   means for selectively applying each of said waveforms to selected ones of said shift registers to alternately operate said shift registers, whereby said parallel multibit digital words are converted into a plurality of serial data streams at a data rate effectively equal to twice said first frequency.

2. A high speed parallel-to-serial converter in accordance with claim 1, wherein said doubling means includes means for converting the first frequency output of said digital clock into positive and negative going waveforms, said positive going waveform being applied to a first differential amplifier to generate a phase "A" clock signal, and said negative going waveform being applied to a second differential amplifier to generate a phase "B" clock signal, said first and second differential amplifiers residing on a single silicon substrate.

3. A high speed parallel-to-serial converter in accordance with claim 2, wherein said phase "A" clock signal is applied to a first flip-flop to generate a load "A" clock signal, and said phase "B" clock signal is applied to a second flip-flop to generate a load "B" clock signal.

4. A high speed parallel-to-serial converter in accordance with claim 3, wherein said phase "A" clock signal is 180° out of phase with said phase "B" clock signal.

5. A high speed parallel-to-serial converter in accordance with claim 4, wherein said load "A" clock signal is 90° out of phase with said load "B" clock signal.

6. A high speed parallel-to-serial converter in accordance with claim 1, wherein said predetermined phase relationship between a first and second of said waveforms is equal to 180° out of phase and, wherein said predetermined phase relationship between a third and fourth of said waveforms is equal to 90° out of phase.

7. A high speed parallel-to-serial converter in accordance with claim 6, wherein said plurality of shift registers is limited to two shift registers, and each of said two shift registers include a data input port, a load command port, and a clock input port.

8. A high speed parallel-to-serial converter in accordance with claim 7, wherein odd numbered bits of a multibit digital word are applied to the data input port of the first of said two shift registers, and the even numbered bits of a multibit digital word are applied to the data input port of the second of said two shift registers.

9. A high speed parallel-to-serial converter in accordance with claim 8, wherein the first of said waveforms is applied to the clock input port of said first shift register, the second of said waveforms being applied to the clock input port of said second shift register, the third of said waveforms being applied to the load command port of said second shift register, and the fourth of said waveforms being applied to the load command port of said first shift register.

10. A high speed parallel-to-serial converter in accordance with claim 9, wherein said digital clock and each of said shift registers are comprised of TTL type circuits.

11. A high speed parallel-to-serial converter, in accordance with claim 10, wherein the serial output waveforms of said two TTL shift registers are converted to ECL type waveforms.

12. A method of effectively doubling the frequency of the output waveform of a digital clock operating at a first frequency comprising the steps of:

converting the output waveform of said digital clock into a first positive going waveform and a second negative going waveform, and applying said first positive going waveform to a first differential amplifier and said second negative going waveform to a second differential amplifier, said first and second differential amplifiers residing on a single silicon substrate, whereby equal amounts of delay are imposed on said first positive going waveform and said second negative going waveform by said first and second differential amplifiers.

13. A method in accordance with claim 12 wherein the respective outputs of said first and second differential amplifiers are 180° out of phase, the method further including the step of selecting the consecutive leading edges of each of said outputs to effectively generate a waveform having a frequency equal to twice said first frequency.

14. A method in accordance with claim 13, wherein said digital clock is comprised of TTL type circuits and said first frequency is equal to 60 MHZ.

* * * * *